United States Patent
Narang et al.

(10) Patent No.: US 10,862,714 B1
(45) Date of Patent: Dec. 8, 2020

(54) ON-DIE RECEIVER COUPLING CAPACITANCE TESTING

(71) Applicant: XILINX, INC., San Jose, CA (US)

(72) Inventors: Nakul Narang, Singapore (SG); Hsung Jai Im, San Jose, CA (US); Kee Hian Tan, Singapore (SG)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/670,175

(22) Filed: Oct. 31, 2019

(51) Int. Cl.
 *H04L 25/02* (2006.01)
 *H04L 25/45* (2006.01)
 *H04L 12/26* (2006.01)
 *H01L 49/02* (2006.01)

(52) U.S. Cl.
 CPC ............ *H04L 25/028* (2013.01); *H01L 28/40* (2013.01); *H04L 25/0292* (2013.01); *H04L 25/45* (2013.01); *H04L 43/50* (2013.01)

(58) Field of Classification Search
 CPC ... H04L 25/028; H04L 25/45; H04L 25/0292; H04L 43/50; H01L 28/40
 See application file for complete search history.

(56) References Cited

U.S. PATENT DOCUMENTS

| 9,306,609 | B1* | 4/2016 | LaCroix | H04B 3/548 |
| 9,887,710 | B1 | 2/2018 | Lim et al. | |
| 2014/0333327 | A1* | 11/2014 | Baruch | G01R 31/2834 324/658 |

* cited by examiner

*Primary Examiner* — Ted M Wang
(74) *Attorney, Agent, or Firm* — Patterson + Sheridan, LLP

(57) ABSTRACT

A method for testing on-die capacitors is provided. The method comprises transmitting, during a first time period, a first modulated testing signal from a first transmitter port of a transmitter to a first receiver port of a receiver along a first path of a differential signal, the first receiver port connected to a first on-die capacitor in the receiver along the first path; driving, during the first time period, a constant voltage on a second transmitter port of the transmitter to a second receiver port of the receiver along a second path of the differential signal comprising a second on-die capacitor; and determining whether the first on-die capacitor is functional, based on the first modulated testing signal.

13 Claims, 10 Drawing Sheets

ON-DIE RECEIVER COUPLING CAPACITANCE TESTING

TECHNICAL FIELD

Examples of the present disclosure generally relate to integrated circuits and, in particular, to testing on-die capacitors in receivers of integrated circuits.

BACKGROUND

Defects or abnormalities can occur during the manufacturing of integrated circuits (also referred to as chips), especially with the advent of alternating current (AC) coupling in differential domains. Specifically, these defects or abnormalities can occur in the structure of substrate of the chips, and can degrade the performance and the utility of a chip. In the worst case, the defects or abnormalities can render the chip useless. These defects include abnormalities such as missing components, electrical shorts, as well as spoiled devices. Thus, detection of abnormalities or defects is important to ensure proper functionality of the silicon and chip.

SUMMARY

These and other aspects may be understood with reference to the following detailed description. One example is a method for testing on-die capacitors. The method includes transmitting, during a first time period, a first modulated testing signal from a first transmitter port of a transmitter to a first receiver port of a receiver along a first path of a differential signal, the first receiver port connected to a first on-die capacitor in the receiver along the first path; driving, during the first time period, a constant voltage on a second transmitter port of the transmitter to a second receiver port of the receiver along a second path of the differential signal comprising a second on-die capacitor; and determining whether the first on-die capacitor is functional, based on the first modulated testing signal.

Another example is a communication system. The system includes a transmitter comprising a first transmitter port and a second transmitter port, and a receiver comprising a first receiver port and a second receiver port. The system further comprises first and second signal paths forming a differential signal path that communicatively couples the transmitter and the receiver. The transmitter of the system is configured to transmit, during a first time period, a first modulated testing signal from the first transmitter port to the first receiver port along the first path, the first receiver port connected to a first on-die capacitor in the receiver along the first path; drive, during the first time period, a constant voltage on the second transmitter port to the second receiver port along the second path; and determine whether the first on-die capacitor is functional, based on the first modulated testing signal.

Another example is a method for testing on-die capacitors. The method includes enabling a first signal to a first NAND gate of a driver circuit of a transmitter; disabling a second signal to a first NOR gate of the driver circuit; disabling a third signal to a second NAND gate of the driver circuit, enabling a fourth signal to a second NOR gate of the driver circuit; generating a transmitter output voltage at a first transmitter port coupled to a first receiver port of a receiver, the transmitter output voltage passing to the receiver via the first receiver port and generating an output voltage at a first output receiver port.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Figure 1:
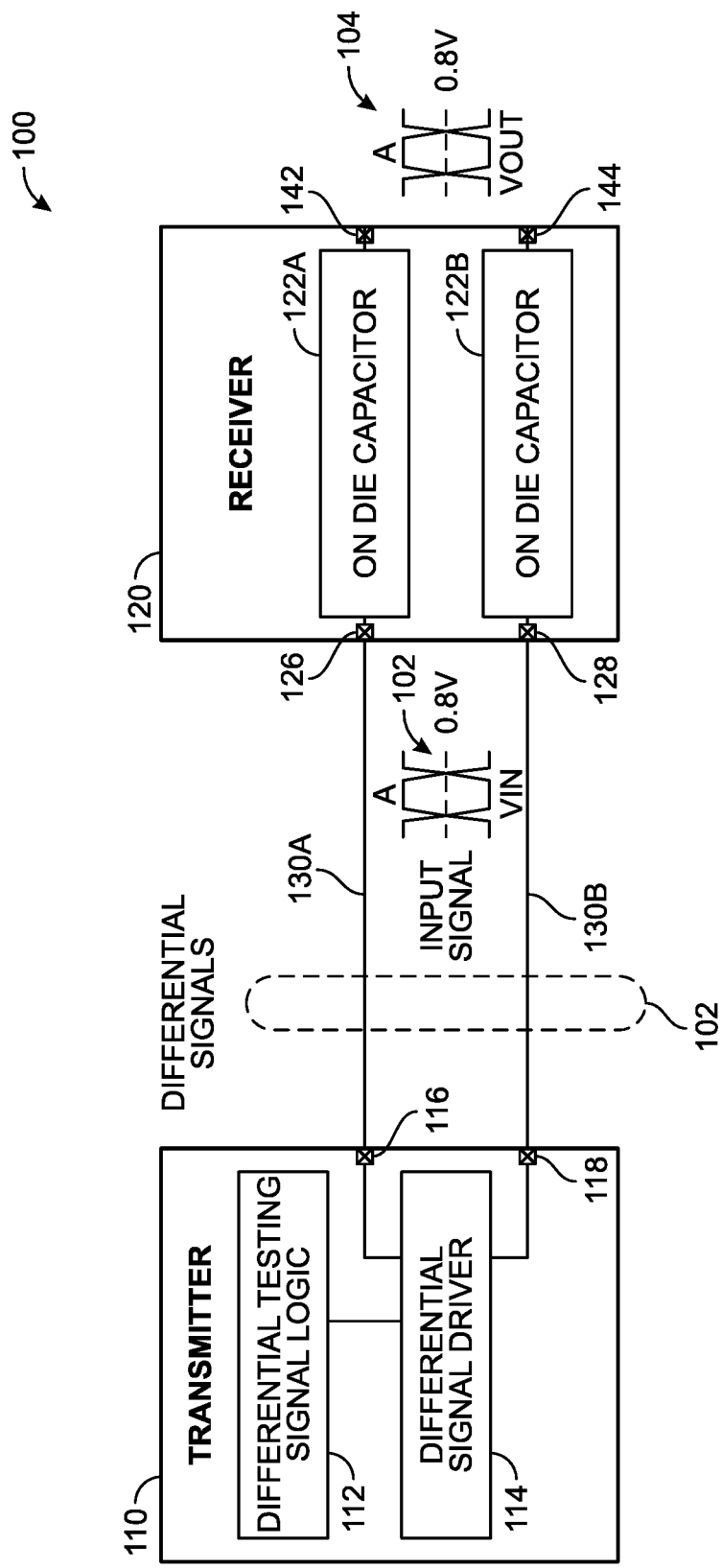
FIG. 1 illustrates a communications system with a transmitter configured to test an on-die capacitor of a receiver, according to some examples.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example does not need to have all the aspects or advantages shown. An aspect or an advantage described in conjunction with a particular example is not necessarily limited to that example and can be practiced in any other examples even if not so illustrated, or if not so explicitly described.

Examples herein relate to testing on-die capacitors in receivers of integrated circuits. The techniques disclosed herein can be used for testing whether on-die capacitors in a receiver are defective. As described herein, the capacitor testing technique can involve the transmitter sending signals to the receiver, and whether on-die capacitors in receiver are defects depends on the receiver's response to the signals from the transmitter. In a capacitor testing technique, during a first time period, the transmitter can transmit a first modulated testing signal from a first transmitter port of a transmitter to a first receiver port of a receiver along a first path of a differential signal. The first port can be connected to an on-die capacitor in the receiver along the first path. A constant voltage can be driven, during the first time period, on a second transmitter port of the transmitter to a second receiver port of the receiver along a second path of the differential signal. Based on the first modulated testing signal, the first on-die capacitor is determined to be either functional non-functional.

The capacitor testing techniques disclosed herein can be used with ICs having transmitters and receivers. An example capacitor testing technique can be used to test on-die capacitors in receivers of differential signaling systems. Based on the output at the final stage of the receiver, the on-die capacitors in the receiver can be screened in mass production thus reducing the overall screening time and identifying the defects in ICs. Additionally, the capacitor testing technique can individually test each on-die capacitor in order to accurately determine whether the on-die capacitor is functional, without interference from any other on-die capacitor, especially in the case where one on-die capacitors is functional and another on-die capacitor is defective.

While the capacitor testing techniques are discussed with reference to a transmitter and a receiver, the techniques disclosed herein can also apply to chip-to-chip communications.

FIG. 1 illustrates a communications system with a transmitter configured to test an on-die capacitor of a receiver, according to some examples. The communications system 100 can be incorporated into an IC (e.g., FPGA 800 in FIG. 8). In certain examples, the communications system 100 includes a transmitter 110 and a receiver 120. In some examples, the communications system 100 includes a transceiver comprising the transmitter 110 and the receiver 120. The transmitter 110 and the receiver 120 can be a part of a serializer-deserializer (SERDES), and the SERDES can be disposed on the IC.

In certain examples, the transmitter 110 generates and transmits a modulated testing signal from one of the transmitter ports 116, 118 to the receiver 120. The transmitter 110 can comprise differential testing signal logic 112, a differential signal driver 114, a first transmitter port 116, and a second transmitter port 118. In some examples, the system 100 uses differential signals (or complementary signals) (e.g., differential signals 102), and so the transmitter 110 transmits a signal along the first transmitter port 116 and a second signal along the second transmitter port 118. In some examples, the signals sent along each port 116, 118 are inverted relative to each other (e.g., are out of phase by 180 degrees) and accordingly, the first transmitter port 116 is a positive port (also referred herein as TXp) for transmitting a positive version of the signals, and the second transmitter port 118 is a negative port (also referred herein as TXn) for transmitting a negative version of the signals.

In certain examples, the receiver 120 receives the modulated testing signal from the transmitter 110 using one of the receiver ports 126, 128. The receiver can comprise a first receiver port 126, a second receiver port 128, a first on-die capacitor 122a and a second on-die capacitor 122b (referred generally as on-die capacitors 122). Similar to the transmitter 110, because the system uses differential signals, the receiver 120 can receive a first signal at the first receiver port 126 and a second signal at the second receiver port 128. In some examples, the first transmitter port is a positive port (also referred herein as RXp) for receiving a positive version of the signals, and the second transmitter port 128 is a negative port (also referred herein as RXn) for receiving a negative (inverted) version of the signals.

In certain examples, the transmitter 110 and the receiver 120 communicate with each other on two paths: a first path 130a and a second path 130b. The first path 130a can couple the transmitter 110 via the first transmitter port 116 to the receiver 120 via the first receiver port 126, and the first on-die capacitor 122a can be along the first path 130a. The second path 130b can couple the transmitter 110 via the second transmitter port 118 to the receiver 120 via the second receiver port 128, and the second on-die capacitor 122b can be along the second path 130b. The transmitter 110 can pass a first signal of the differential signals 102 from the first transmitter port 116 to the first receiver port 126 and a second signal of the differential signals 102 from the second transmitter port 118 to the second receiver port 128. In some examples, if the on-die capacitors 122 are functional, the receiver 120 outputs the differential signals as received at the output receiver ports 142, 144. However, if either or both of the on-die capacitors 122 are nonfunctional, the signals at the output receiver ports 142, 144 are changed based on the state of any one of the on-die capacitors (e.g., shorted, open).

Figure 2:
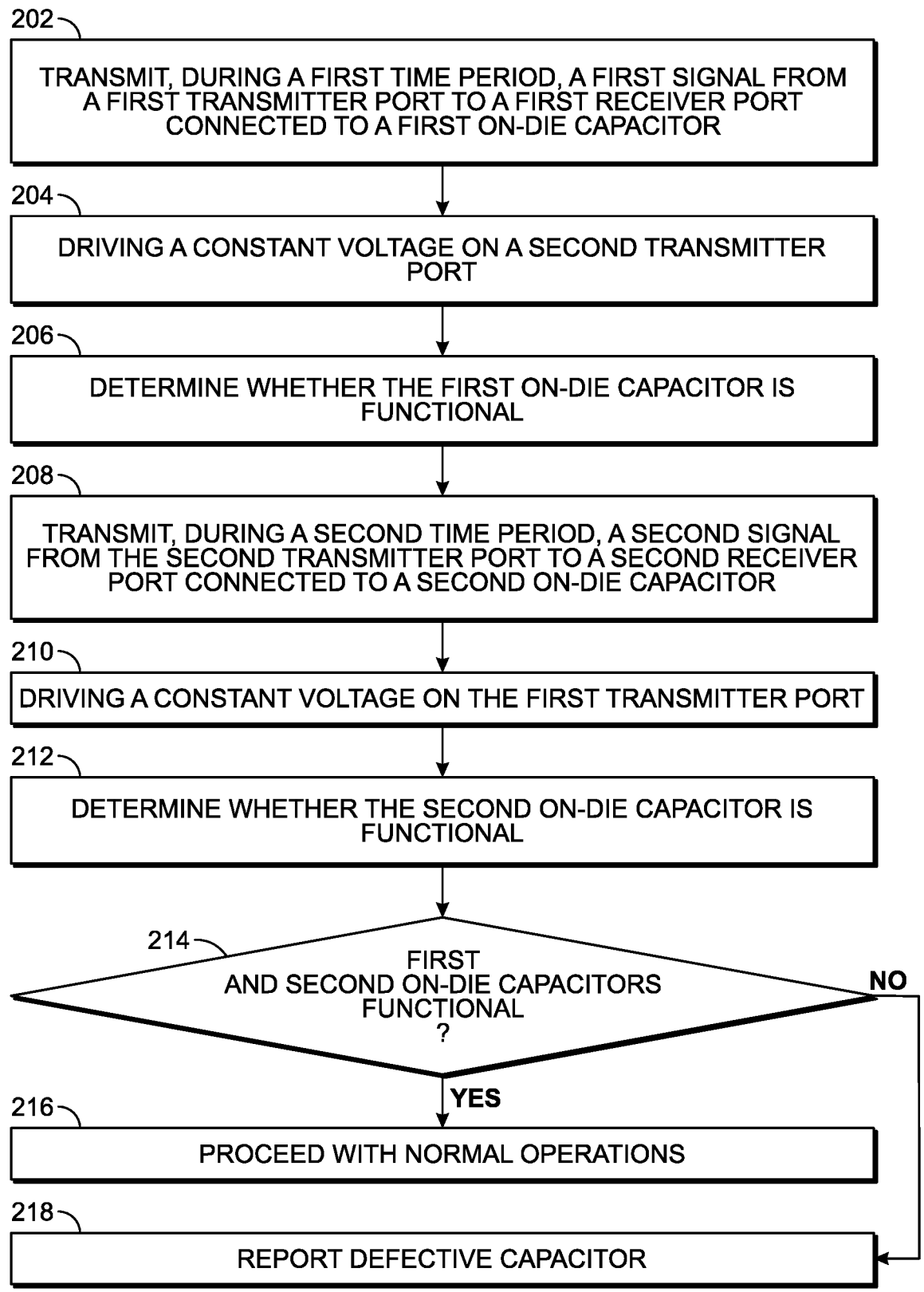
FIG. 2 is a flow chart for testing on-die capacitors on a receiver using a communication system, according to some examples.

FIG. 2 is a flow chart of example operations for testing on-die capacitors on a receiver using the communication systems 100 of FIG. 1, according to some examples. In some examples, transmitter 110 of FIG. 1 performs operations 200 to test the on-die capacitors 122 of the receiver 120.

Operations 200 begin, at block 202, with the transmitter (e.g., transmitter 110) transmitting, during a first time period, a first signal from a first transmitter port (e.g., transmitter port 116) to a first receiver port (e.g., receiver port 126) of the receiver (e.g., 120) connected to a first on-die capacitor (e.g., on-die capacitor 122a, 122b). The first on-die capacitor can be either on-die capacitor 122a or on-die capacitor 122b on the second path 130b in the receiver 120. In some examples, the first signal is a modulated testing signal generated by the transmitter 110. Details about the modulated testing signal and the generation thereof are provided below with reference to FIG. 4.

At block 204, the transmitter 110 drives a constant voltage on a second transmitter port (e.g., transmitter port 118). Details about the constant voltage and the generation thereof are provided below with reference to FIG. 4.

Figure 3A:
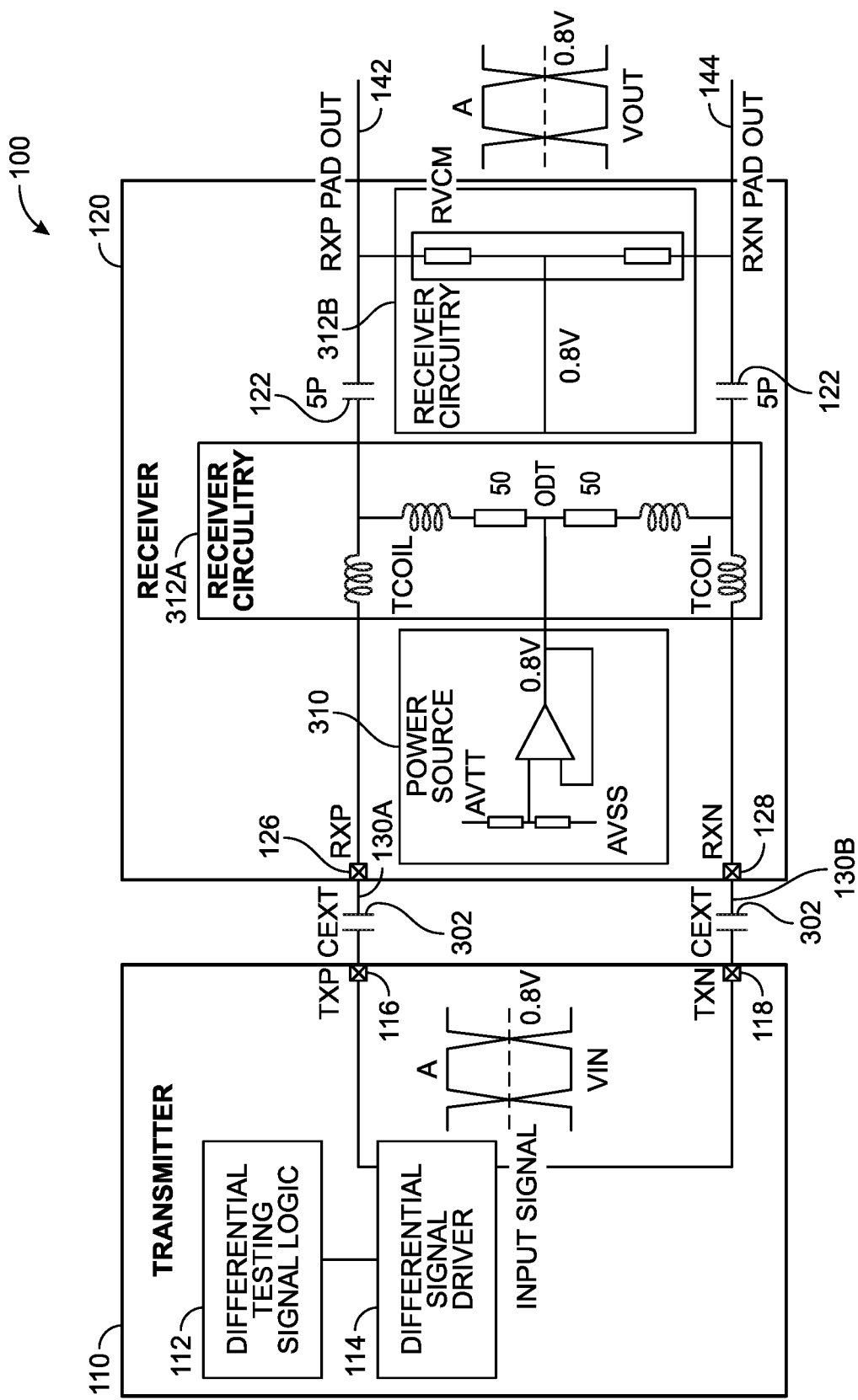
FIGS. 3A-3C illustrate components of the transmitter and receiver of a communications system configured to use a capacitor testing technique, according to some examples.
Figure 3B:
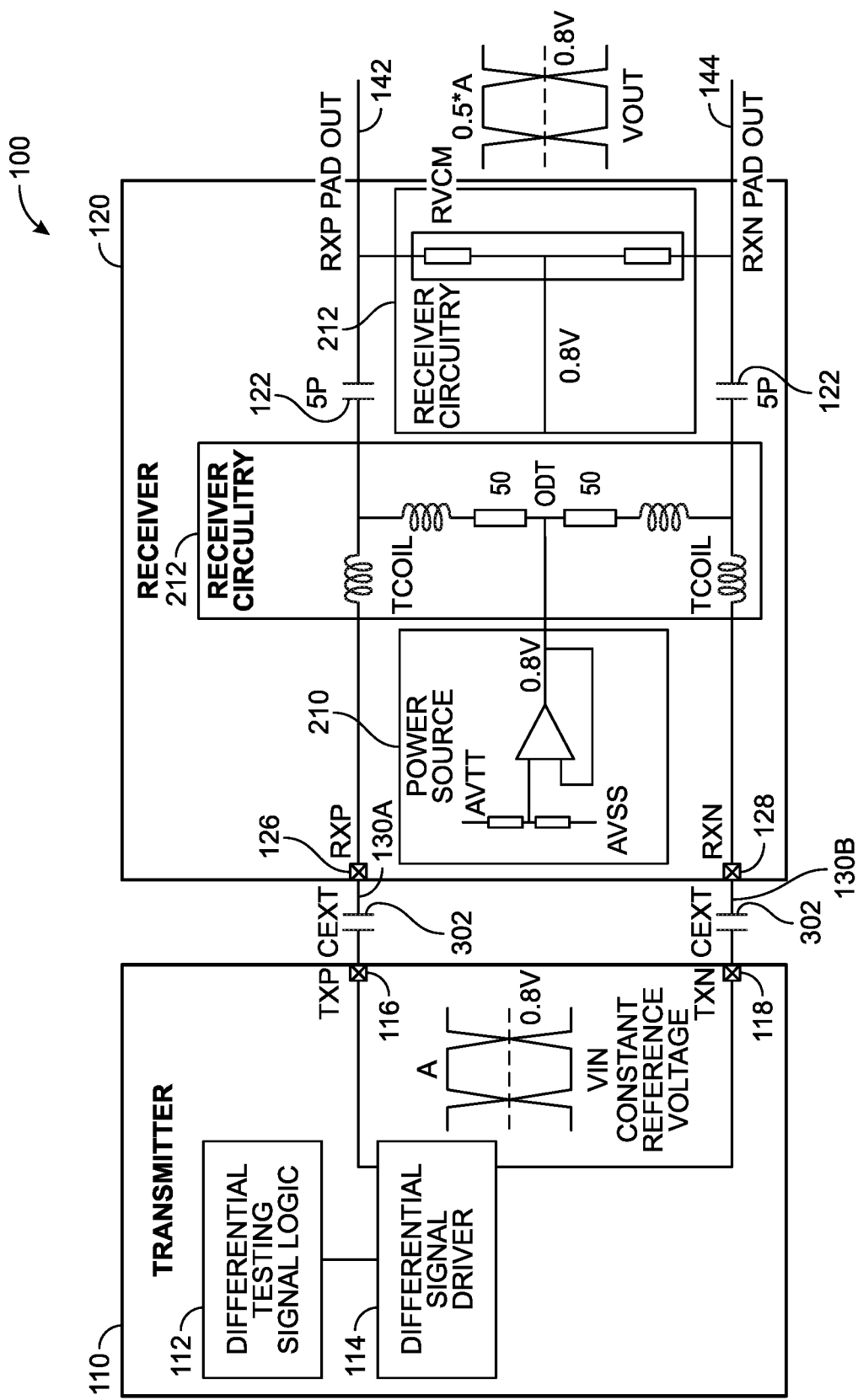
Figure 3C:
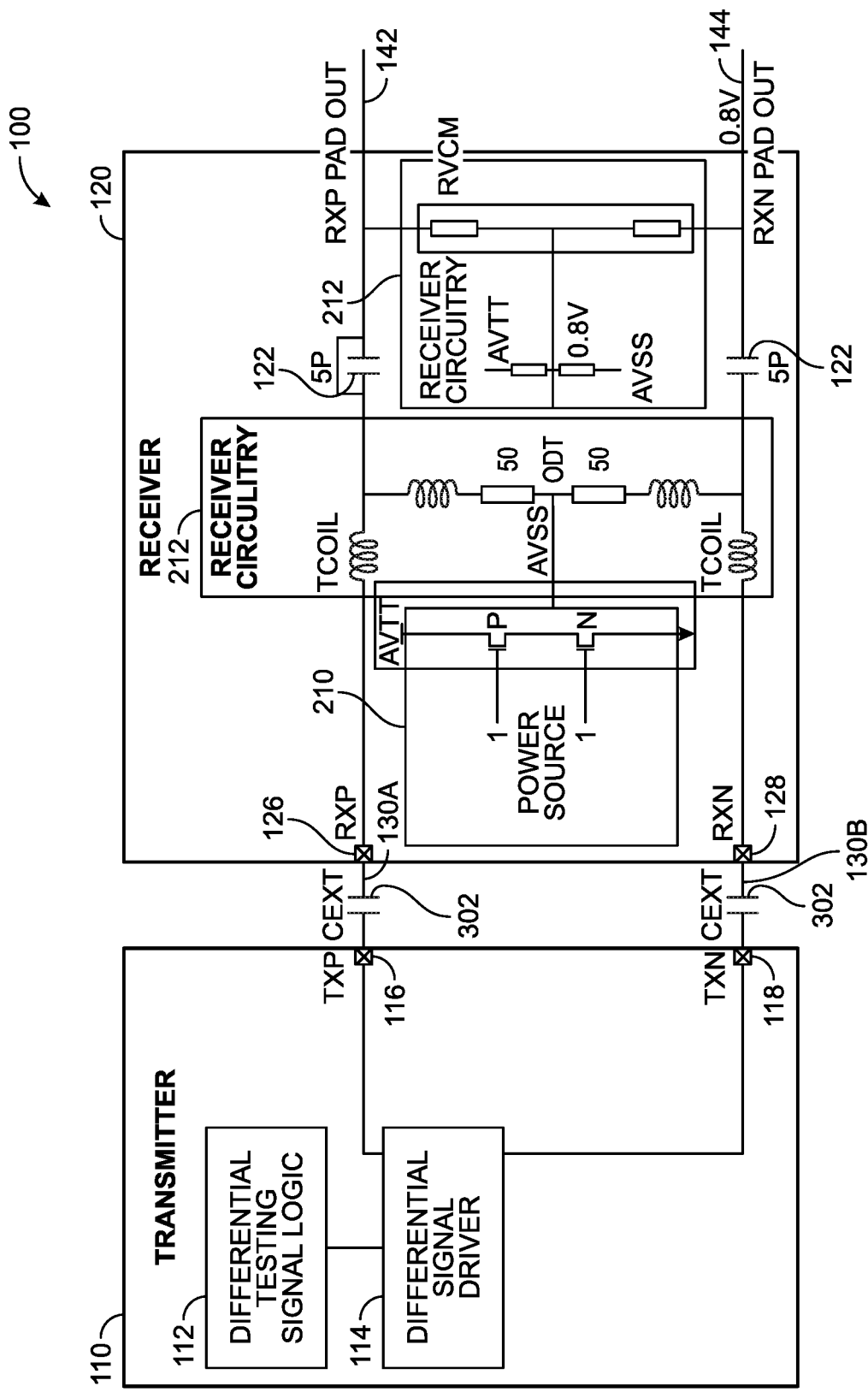

At block 206, the transmitter 110 determines whether the first on-die capacitor 122a is functional. Because the transmitter 110 transmits a modulated testing signal on the first path 130a and a constant voltage on the second path 130b, the transmitter 110 can determine the state of the on-die capacitor 122a on the first path 130a. FIGS. 3A-3C illustrate some examples of the state of the on-die capacitor and the corresponding output from the output receiver ports 142, 144.

At this point, the transmitter 110 can optionally continue with testing a second on-die capacitor (e.g., on-die capacitor 122b on the second path 130b) in the receiver 120. In some examples, the transmitter 110 tests the first on-die capacitor 122a in blocks 202 204, and 206, and proceeds to block 214 to determine further actions based on whether the first on-die capacitor 122a on the first path 130a is functional or defective.

At block 208, the transmitter 110 transmits during a second time period, a second signal from the second transmitter port 118 to the second receiver port 128 connected to a second on-die capacitor 122b. The second on-die capacitor can be either on-die capacitor 122a on the first path 130a or on-die capacitor 122b on the second path 130b. In some examples, because on-die capacitor 122a on the first path 130a was tested, the second on-die capacitor is on-die capacitor 122b on the second path 130b. In some examples, the second signal is a modulated testing signal generated by the transmitter 110, and can be complementary to the first modulated testing signal. Details about the modulated testing signals and the generation thereof are provided below with reference to FIG. 4.

At block 210, the transmitter 110 drives a constant voltage on the first transmitter port 116. Details about the constant voltage and the generation thereof are provided below with reference to FIG. 4.

At block 212, the transmitter 110 determines whether the second on-die capacitor 122b is functional. Like at block 206, because the transmitter 110 transmitted a modulated testing signal on the second path 130b and a constant voltage on the first path 130a, the transmitter 110 can determine the state of the on-die capacitor 122b on the second path 130b. By testing each on-die capacitor 122 individually, the on-die capacitor testing technique can identify ICs that have both a defective on-die capacitor and a functional on-die capacitor that would have not been identified if the programmable ICs tested both on-die capacitors simultaneously. For example, if both on-die capacitors are tested simultaneously, both on-die capacitors can appear to be functional, despite a small change in capacitor response, even though one of them is not. Accordingly, the on-die capacitor testing technique can test each on-die capacitor individually to prevent false identification of functional on-die capacitors.

While FIGS. 3A-3C illustrate states of the first on-die capacitor 122a and the corresponding output from the output receivers 142, 144, the second on-die capacitor 122b can have the states similar to those of the first on-die capacitor 122a (e.g., shorted, open) and can have corresponding output from the output receiver ports 142, 144.

At block 214, the transmitter 110 examines whether both the first on-die capacitor 122a and the second on-die capacitor 122b are functional. In some examples, the transmitter 110 completes examination upon completion of the determining the functional state of the first on-die capacitor 122a at block 206 and of the second on-die capacitor 122b at block 212.

If they are both functional, the transmitter 110 can proceed with normal operations at block 216. In some examples where one on-die capacitor (either the first on-die capacitor 122a or second on-die capacitor 122b) was tested, the transmitter 110 can proceed with normal operations if the tested on-die capacitor was determined to be functional.

If either of the capacitors 122 is non-functional, the transmitter 110 can report that one of the capacitors 122 is non-functional. In some examples where one on-die capacitor (either the first on-die capacitor 122a or second on-die capacitor 122b) was tested, the transmitter 110 reports that the tested on-die capacitor was non-functional. In some examples, the transmitter 110 reports the outputs at the first output receiver port and the second output receiver port, and therefore provides information about the state of the on-die capacitor.

FIG. 3A-3C illustrates components of the transmitter 110 and receiver 120 of the communications system 100 configured to use the capacitor testing technique of FIG. 2, according to some examples. Specifically, FIGS. 3A-3C illustrate different states of the on-die capacitors 122 in the receiver 120, and the capacitor testing techniques of FIG. 2 can test for the different states of the on-die capacitors 122.

In some examples, the communication system 100 can include external capacitors 302 between the transmitter ports 116, 118 and the receiver ports 126, 128. As illustrated, an external capacitor 302 can be disposed on the first path 130a between the first transmitter port 116 and the first receiver port 126, and another external capacitor 302 can be disposed on the second path 130b between the second transmitter port 118 and the second receiver port 128.

In certain examples, the receiver 120 comprises a power source 310 and receiver circuitry 312. The power source 310 can regulate the power reaching the on-die capacitors 122 on both the first path 130a and the second path 130b. Similarly, the receiver circuitry 312b can regulate and modulate the signals to the on-die capacitors 122 on both the first path 130a and the second path 130b.

In some examples, the power source 310 comprises an AVTT power domain and an AVSS power domain, resistors between the two power domains, and an op-amp arranged in a feedback loop. In some examples, the op-amp feeds a pre-set amount of voltage (e.g., 0.8 V) to the receiver circuitry 312 (either receiver circuitry 312a or receiver circuitry 312b).

In some examples, receiver circuitry 312 comprises circuit components that facilitate the transmission of the differential signals received at the receiver ports 126, 128 through the receiver 120 to the output receiver ports 142, 144. Circuit components of the receiver circuitry 312 can include inductors and resistors. The inductors can have any amount of inductance and the resistors can have any amount of resistance. In some examples, the receiver circuitry 312a can be disposed between the receiver ports 126, 128 and the on-die capacitors 122, while receiver circuitry 312b can be disposed between and connected to the on-die capacitors. Accordingly, the receiver circuitry 312a can be connected to a first side of the on-die capacitors 122 and receiver circuitry 312b is connected to a second side of the on-die capacitors 122. In some examples, the output receiver ports 144, 146 are connected to the on-die capacitors 122a and 122b and the receiver circuitry 312b.

As mentioned, the on-die capacitors 122 can be defective because the one or both of the capacitors 122 are open or are shorted. FIG. 3A illustrates the on-die capacitors as designed as intended; however, the on-die capacitors 122 can be open as illustrated in FIG. 3B or shorted as illustrated in FIG. 3B as a result of a manufacturing or fabrication defect.

In the scenarios shown in FIGS. 3B and 3C, the transmitter 110 can send signals to the receiver 120, and the output of the receiver 120 can be based on the state of the capacitors 122. In the case of an open or broken circuit (illustrated in FIG. 3B), the receiver 120 receives the testing input signal from the negative transmitter port 118 and negative receiver port 128, and produces a degraded output, resulting in a reduced swing. In the case of a shorted capacitor (illustrated in FIG. 3C), the receiver 120 receives the signals from the receiver ports 126, 128 but because one of the signals passes through a shorted capacitor, it correspondingly becomes grounded and the receiver 120 produces constant voltages on its output receiver ports 142, 144. According, monitoring both receiver ports 126, 128 of the receiver 120 independently is important. In the case where both coupling capacitors 122 are defective, the receiver 120 may not have an output.

FIG. 3A illustrates an example where the first on-die capacitor 122a and the second on-die capacitor 122b are functional. In such example, the receiver 120 receives differential signals 102 and produces output signals 104 having the same properties as the differential signals 102 passed from the transmitter 110.

FIG. 3B illustrate another example where the first on-die capacitor 122a is not on the first path 130a in the receiver 120 and is therefore nonfunctional, while the second on-die 122b on the second path 130b is functional. In such example, the receiver 120 outputs output signals 104 that have half the amplitude as the differential signals 102 passed from the transmitter.

FIG. 3C illustrate another example where the first on-die capacitor 122a is on the first path 130a in the receiver but is shorted out, therefore nonfunctional, while the second on-die capacitor 122b on the second path 130b is functional. In such example, the receiver 120 does not output any differential signals, and instead, the first output receiver port 142 outputs a zero constant voltage while the second output receiver port 144 outputs a constant voltage.

Figure 4:
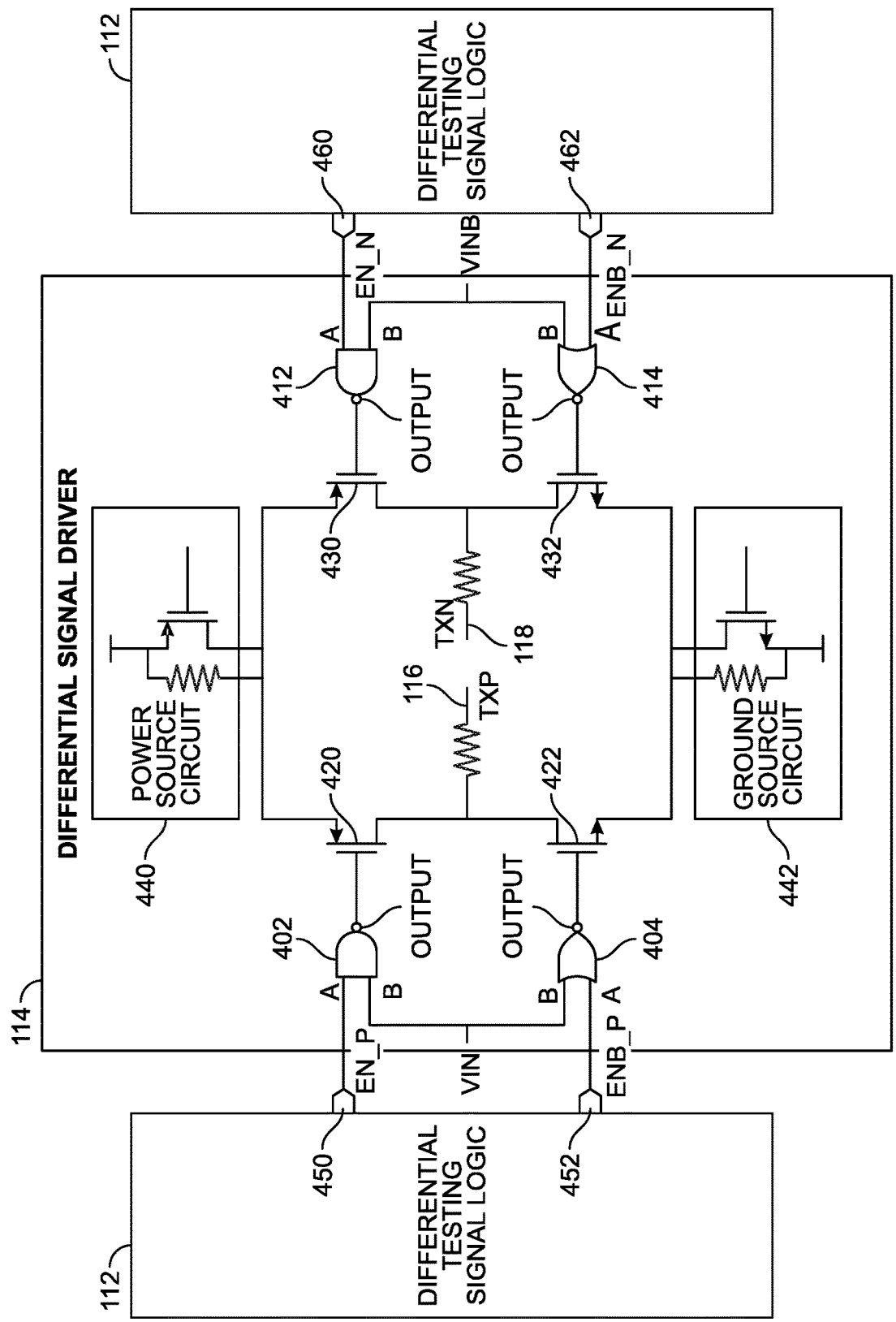
FIG. 4 illustrates components of the transmitter having components for testing on-die capacitors in a receiver, according to some examples.

FIG. 4 illustrates components of the transmitter having components for testing on-die capacitors in a receiver, according to some examples, for scenarios shown in FIG. 3A-3C. As illustrated in FIGS. 1-3, the transmitter 110 can comprise a differential signal driver 114 and differential testing signal logic 112. The differential testing signal logic 112 is illustrated as two separate components in FIG. 4 to demonstrate the connections to the differential signal driver 114, and should not be considered as limiting the present disclosure.

In some examples, the differential testing signal logic 112 allows the user to configure the transmitter 110 to deliver the output in a single ended signal configuration as well in the differential signal configuration, thus enabling the user to test the on-die capacitors together as well as independently. For example, when the en_p signal has a value equal to 1 and the en_n signal has a value of 0, the data transmitted through the transmitter ports 116, 118 is almost static.

In some examples, the differential signal driver 114 is a voltage mode driver. In some examples, the differential signal driver 114 is a source-series terminated (SST) driver. The differential signal driver 114 can comprise a first NAND gate 402, a first NOR gate 404, a second NAND gate 412, and a second NOR gate 414, each of which are connected to the differential testing signal logic 112. The NAND gates 402, 412 and the NOR gates 404, 414 can control of the pull up and pull down of the driver 114 by enabling and disabling logic signals from the differential testing signal logic 112.

Each of the first NAND gate 402 and the first NOR gate 404 can receive logic signals from the differential testing signal logic 112 via the input nodes A coupled to the input signal nodes 450, 452. Each of the first NAND gate 402 and the first NOR gate 404 can also receive a first voltage (Vin) via the input nodes B. Similarly, each of the second NAND gate 412 and the second NOR gate 414 can receive logic signals from the differential testing signal logic 112 via the input nodes A coupled to the input signal nodes 460, 462. Each of the second NAND gate 412 and the second NOR gate 414 can also receive a second voltage (Vinb) via input nodes B.

In the illustrated examples, the output nodes from the first NAND gate 402 and the first NOR gate 404 are coupled to the gate terminals of transistors 420, 422, and the transistors 420, 422 are in turn coupled together to the first transistor port 116. Similarly, in the illustrated examples, the output nodes from the second NAND gate 412 and the second NOR gate 414 are coupled to the gate terminals of the transistors 430, 432, and the transistors 430, 432 are in turn coupled together to the second transistor port 118. The output signals at the output nodes of these gates can pass to the transistors 420, 422, 430, 432.

The transistors 420, 430 are coupled to a power source circuit 440, and the transistors 422, 432 are coupled to a ground source circuit 442. The power source circuit 440 and the ground source circuit 442 each can provide reference voltages for the transistors 420, 422, 430, 432.

Based on the values the differential testing signal logic 112 sets for the logic signals en_p, enb_p, en_n, and enb_n, the differential signal driver 114 can output a modulated testing signal from either the first transmitter port 116 or the second transmitter port 118, and correspondingly drives a constant voltage on the other transmitter port (e.g., the first transmitter port 116 if the second transmitter port 118 outputs the modulated testing signal, the second transmitter port 118 if the first transmitter port 116 outputs the modulated testing signal).

Figure 5:
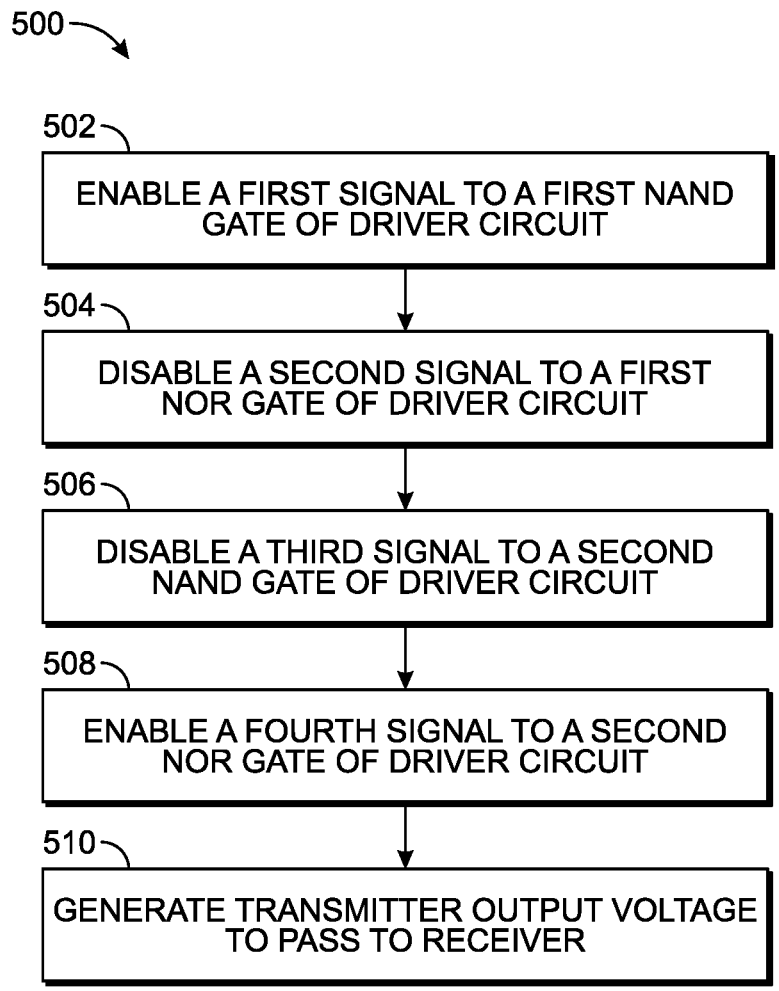
FIG. 5 is a flow chart for testing on-die capacitors of a receiver using a differential signal driver and differential testing signal logic of a transmitter, according to some examples.

FIG. 5 is a flow chart of example operations for testing on-die capacitors of a receiver using the differential signal driver 114 and the differential testing signal logic 112 of FIG. 4, according to some examples. In some examples, transmitter 110 of FIG. 1 performs operations 500 during block 202 of operations 200 of FIG. 2.

Operations 500 begin, at block 502, with the transmitter 110 enabling a first logic signal to a first NAND gate (e.g., NAND gate 402) of a driver circuit (e.g., driver circuit 114) of the transmitter 110. The first logic signal (referred as en_p signal) can have a value of 0 or 1, and by enabling the en_p signal, the en_p signal can have a value of 1. For reference, a logic signal can have a "low" voltage or "high" voltage, which are herein referred as having a value of "0" or "1."

At block 504, the transmitter 110 disables a second logic signal to a first NOR gate (e.g., NOR gate 404) of the driver circuit 114. In some examples, similar to the en_p signal, the second logic signal (referred as enb_p signal) can have a value of 0 or 1, and by disabling the enb_p signal, the enb_p signal can have a value of 0.

In some examples, the en_p signal and the enb_p signal from the differential testing signal logic 112 do not have the same values. For example, when the en_p signal has a value of 1, the enb_p signal can have a value of 0, and when the en_p signal has a value of 0, the enb_p signal can have a value of 1.

In some examples, because the en_p signal is enabled, the first NAND gate 402 allows an inverted version of the first voltage (Vin) to pass through at its output node to the gate terminal of the transistor 420. Based on the value of the first voltage, the transistor 420 can act as either an open switch or a closed switch, and thereby permit or prevent the reference voltage from the power source circuit 440 reaching the first transmitter port 116. Similarly, because the enb_p signal is disabled, the first NOR gate 404 also can allow an inverted version of the first voltage to pass through at its output node to the gate terminal of the transistor 422. In examples where the first voltage is an electronic signal, the electronic signal can control the transistors 420, 422 by pulling up and down the modulated testing signal outputted at the first transmitter port 116 based on the value of the electronic signal at the gate terminals of the transistors 420, 422.

At block 506, the transmitter 110 disables a third logic signal to a second NAND gate (e.g., NAND gate 412) of the driver circuit 114. The third logic signal (referred as en_n signal) can have a value of 0 or 1, and by disabling the en_n signal, the third en_n can have a value of 0.

At block 508, the transmitter 110 enables a fourth logic signal to a second NOR gate (e.g., NOR gate 414) of the driver circuit 114. The fourth logic signal (referred as enb_n signal) can have a value of 0 or 1, and by enabling the enb_n signal, the enb_n signal can have a value of 1.

In some examples, because the en_n signal is disabled, the second NAND gate 412 outputs a signal having a value of 1 at its output node, and accordingly, the transistor 430 acts as open switch thereby preventing the reference voltage from the power source circuit 440 from reaching the second transmitter port 118. Also, when the enb_n signal is enabled, the second NOR gate 414 outputs a signal having a value of 0 at its output node. Accordingly, the transistor 432 acts as closed switch thereby allowing the reference voltage from the ground source circuit 442 to reach the second transmitter port 118. With such configuration, the transmitter 110 can drive a constant ground voltage at the second transmitter port 118.

At block 510, the transmitter 110 generates a transmitter output voltage to pass to the receiver 120. The transmitter 110 generates the transmitter output voltage at a first transmitter port (e.g., transmitter port 116) coupled to a first receiver port (e.g., receiver port 126) of a receiver (e.g., receiver 120). The transmitter output voltage passes to the receiver 120 and generates an output voltage at a first output receiver port (e.g., output receiver port 142). In some examples, the transmitter output voltage is the modulated testing signal, and can be used to determine whether a first on-die capacitor (e.g., on-die capacitor 122a) is functional. For example, in case of an open switch as illustrated in FIG. 3B, the receiver 120 outputs the modulated testing signal with half the amplitude of the modulated testing signal received from the transmitter 110. Similarly, in case of a shorted capacitor as illustrated in FIG. 3C, the receiver 120 outputs the modulated testing signal as a direct current (DC) voltage (e.g., 0.8 V).

In some examples, the transmitter 110 can also generate a constant reference voltage to pass to the receiver 120. In such examples, the transmitter 110 generates the constant reference voltage at a second transmitter port (e.g., transmitter port 118) coupled to a second receiver port (e.g., receiver port 128) of the receiver. The constant reference voltage can reflect the constant voltage of the second voltage (Vinb).

In some examples, the transmitter 110 proceeds to a second time period and tests a second on-die capacitor (e.g., on-die capacitor 122b). During this time period, the transmitter 110 disables the en_p signal and the enb_n signal, so that the value of the en_p signal and the enb_n signal is 0. The transmitter enables the enb_p signal and the en_n signal, so that the value of the enb_p signal and the en_n signal is 1.

As mentioned, the logic signals from the differential testing signal logic 112 can control whether the first transmitter port 116 and the second transmitter port 118 outputs a modulated testing signal or a constant voltage (e.g., ground voltage) to the receiver 120. By disabling the en_p signal to the first NAND gate 402 and enabling the enb_p signal to the first NOR gate 404, the first NAND gate 402 and the first NOR gate 404 act as an open switch and a closed switch respectively. For example, the first NAND gate 402 can output a signal having a value of "1" at its output node, and accordingly the transistors 420 can act as an open switch thereby preventing the reference voltage from the power source circuit 440 from reaching the first transmitter port 116. The first NOR gate 404 can output a signal having a value of "0" at its output node, and accordingly the transistor 422 can act as a closed switch thereby allowing the reference voltage from the ground source circuit 442 to reach the first transmitter port 116. With such configuration, the transmitter 110 can drive a constant ground voltage at the first transmitter port 116.

Also, by enabling the en_n signal and disabling the enb_n signal, the second NAND gate 412 and the second NOR gate 414 allow inverted versions of the second voltage to pass through to their output nodes to the gate terminals of the transistors 430, 432. Based on the value of the second voltage, the transistors 430, 432 can act as either an open switch or closed switch and thereby permit or prevent the reference voltages from the power source circuit 440 and the ground source 442 to reach the second transmitter port 118. In examples where the second voltage is an electronic signal, the electronic signal can control the transistors 430, 432 by pulling up and down the modulated testing signal outputted at the second transmitter port 118 based on the value of the electronic signal at the gate terminals of the transistors 430, 432.

The transmitter 110 can generate the transmitter output voltage at the second transmitter port 118. The transmitter output voltage passes to a second receiver port (e.g., receiver port 128) and generates an output voltage at a second output receiver port (e.g., output transmitter port 144). In some examples, the transmitter output voltage is the modulated testing signal, and can be used to determine whether the second on-die capacitor 122b is functional. For example, in case of an open circuit as illustrated in FIG. 3B, the receiver 120 outputs the modulated testing signal with half the amplitude of the modulated testing signal received from the transmitter 110. Similarly, in case of a shorted capacitor as illustrated in FIG. 3C, the receiver 120 outputs the modulated testing signal as a direct current (DC) voltage (e.g., 0.8 V).

In some examples, the transmitter 110 can also generate a constant reference voltage at the second transmitter port 118 to pass to the receiver 120, and can generate the constant reference voltage at the first transmitter port 116 coupled to the first receiver port 126. The constant reference voltage can reflect the constant voltage of the first voltage (Vin).

In some examples, once the transmitter 110 has completed the operations 500, it continues with the remaining blocks of operations 200.

In some examples, the first logic signal (en_p) and the second logic signal (enb_p) are inverted versions of each other, and the third logic signal (en_n) and the fourth logic signal (enb_n) are inverted versions of each other. In some examples, the en_p signal and the enb_n signal have the same value, and the enb_p and en_n signals have the same value.

Figure 6A:
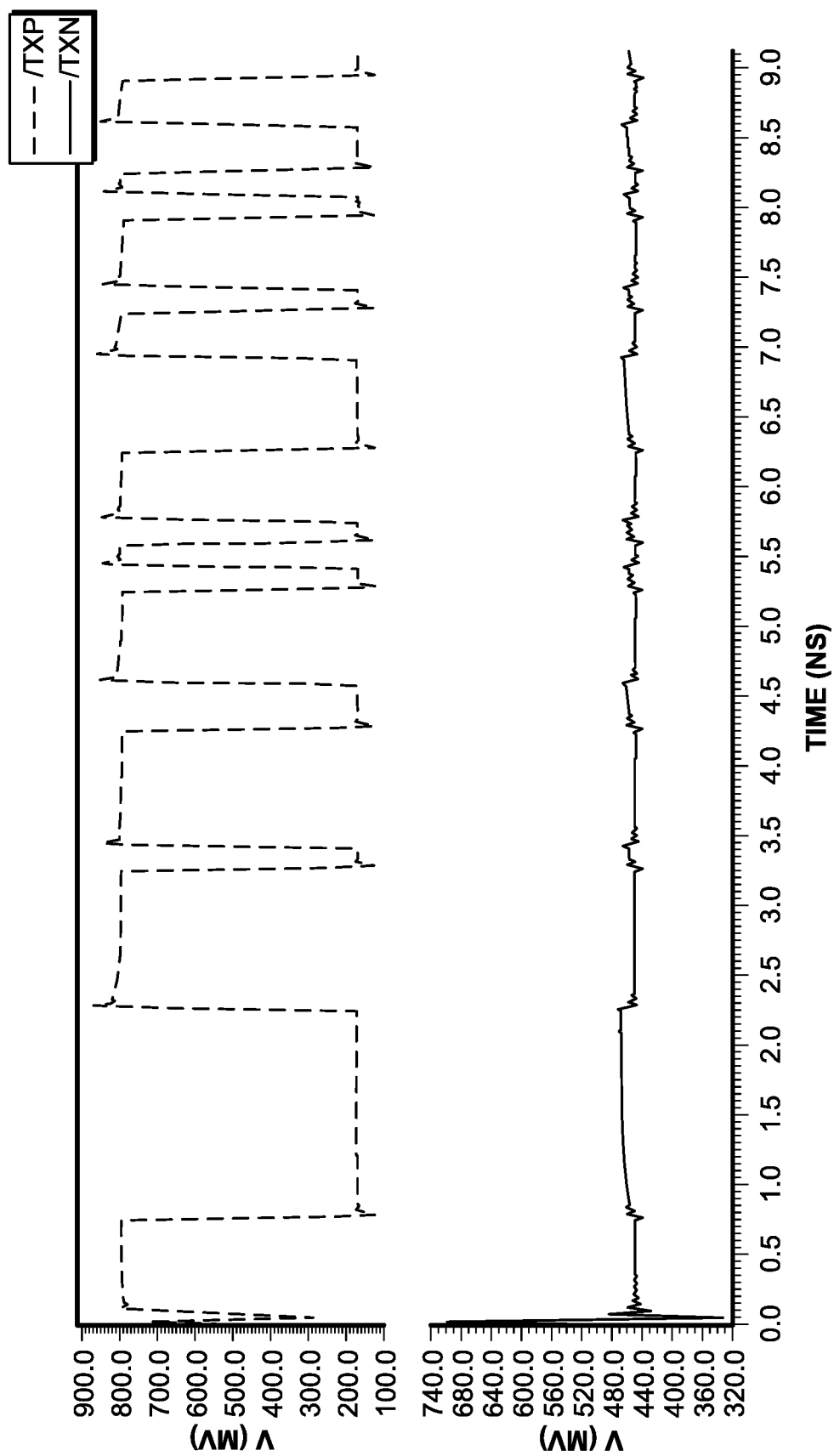
FIGS. 6A-6B illustrate graphs of signals from the transmitter and the corresponding response of the receiver, according to some examples.
Figure 6B:
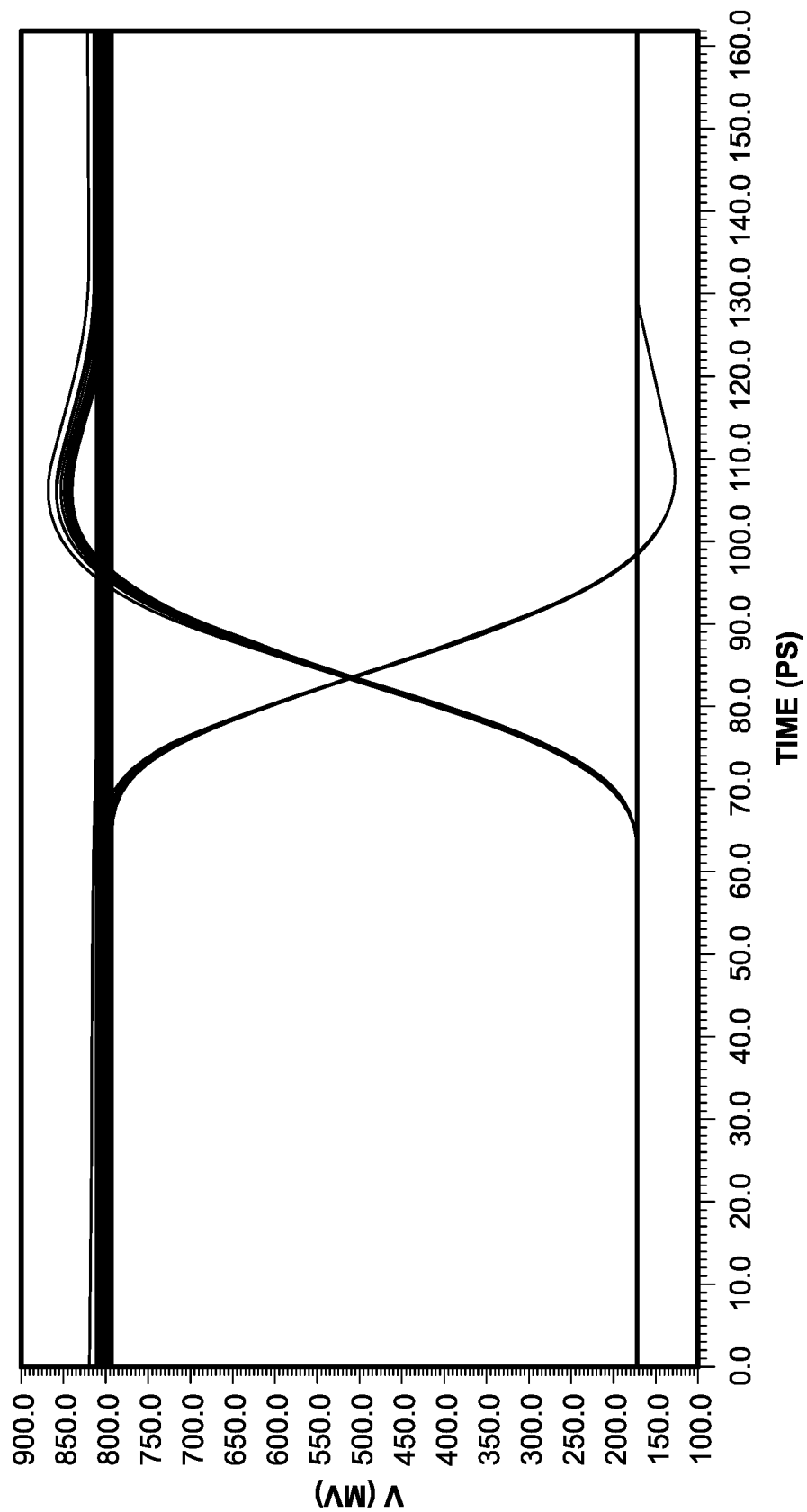

FIG. 6A-6B illustrates graphs of signals from the transmitter and the corresponding capacitor response of the receiver, according to some examples. FIGS. 6A and 6B illustrate simulation results of the use case shown in FIG. 3B, and shows that at one transmitter port, the transmitter is transmitting data and the other transmitter port is transmitting a constant voltage. FIG. 6B illustrates a single-ended output eye diagram of the capacitor response based on the signals.

Figure 7:
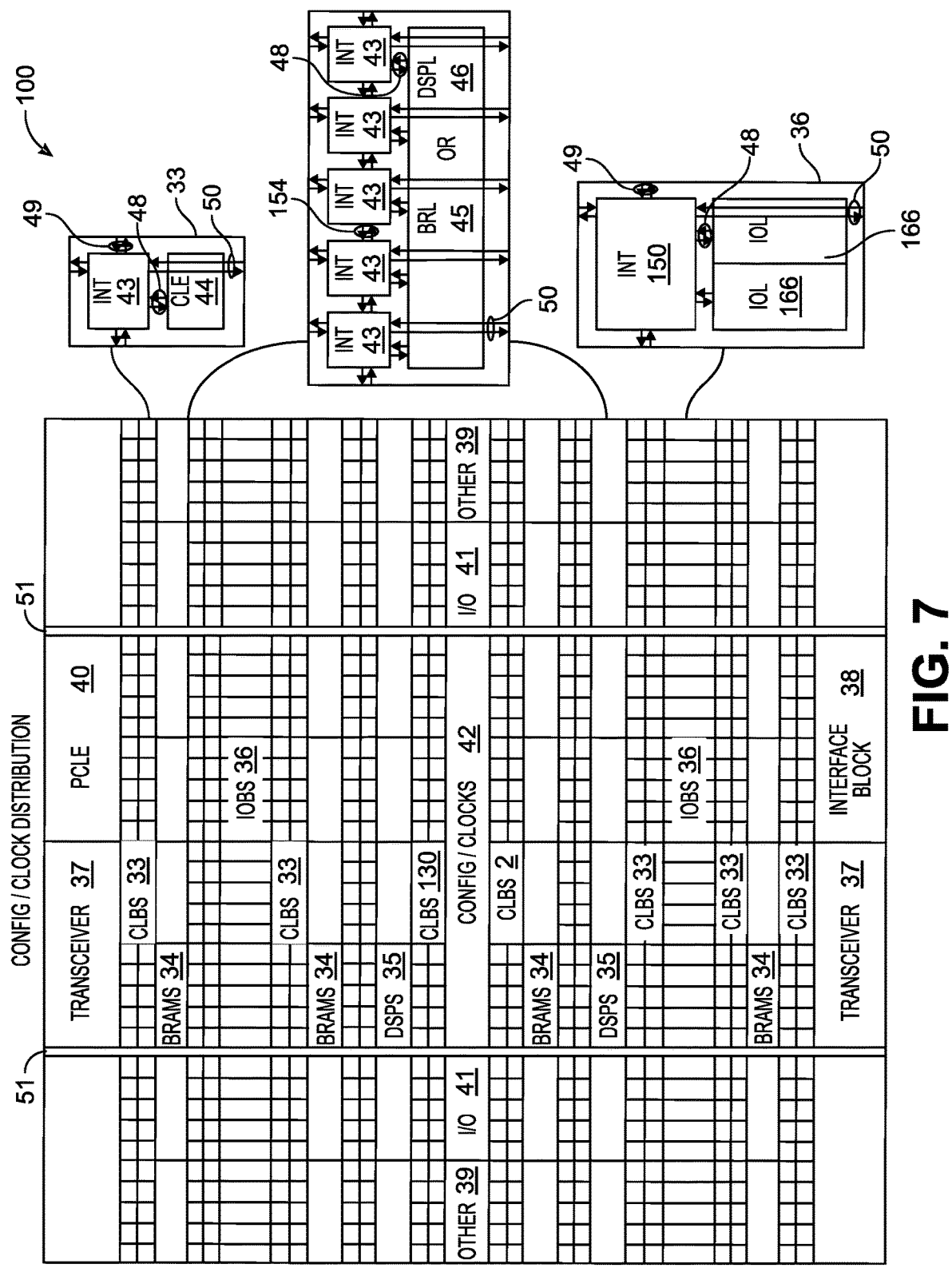
FIG. 7 illustrates a field programmable gate array implementation of a programmable IC, according to an example To facilitate understanding, identical reference numerals have been used, where possible, to designate identical elements that are common to the figures. It is contemplated that elements of one example may be beneficially incorporated in other examples.

FIG. 7 illustrates a field programmable gate array implementation of a programmable IC according to an example. In one embodiment, the programmable IC is an FPGA. FIG. 8 illustrates an FPGA 800 implementation of an IC that includes a large number of different programmable tiles including transceivers 37, CLBs 33, BRAMs 34, input/output blocks ("IOBs") 36, configuration and clocking logic ("CONFIG/CLOCKS") 42, DSP blocks 35, specialized input/output blocks ("I/O") 41 (e.g., configuration ports and clock ports), and other programmable logic 39 such as digital clock managers, analog-to-digital converters, system monitoring logic, and so forth. The FPGA can also include PCI interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 8. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. In one embodiment, the BRAM 34 is one of the memory blocks of memory 140 which can retain stored data during reconfigurations as described above. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 8) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

As will be appreciated by one skilled in the art, the embodiments disclosed herein may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects may take the form of a computer program product embodied in one or more computer readable medium(s) having computer readable program code embodied thereon.

Aspects of the present disclosure are described below with reference to flow chart illustrations and/or block diagrams of methods, apparatus (systems) and computer program products according to embodiments presented in this disclosure. The flow chart and block diagrams in the Figures illustrate the architecture, functionality, and operation of possible implementations of systems, methods, and computer program products according to various examples of the present disclosure. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flow chart illustration, and combinations of blocks in the block diagrams and/or flow chart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A method for testing on-die capacitors, the method comprising
 transmitting, during a first time period, a first modulated testing signal from a first transmitter port of a transmitter to a first receiver port of a receiver along a first path of a differential signal, the first receiver port connected to a first on-die capacitor in the receiver along the first path;
 driving, during the first time period, a constant voltage on a second transmitter port of the transmitter to a second receiver port of the receiver along a second path of the differential signal comprising a second on-die capacitor; and
 determining whether the first on-die capacitor is functional, based on the first modulated testing signal.

2. The method of claim 1, wherein the first modulated testing signal and the constant voltage are driven by a transmitter driver circuit, the transmitter driver circuit coupled to the first transmitter port and to the second transmitter port.

3. The method of claim 2, wherein the transmitter driver circuit comprises a NAND gate and a NOR gate coupled together to drive the first modulated testing signal to the first transmitter port.

4. The method of claim 2, wherein the transmitter circuit comprises a NAND gate and a NOR gate coupled together to drive the constant voltage to the second transmitter port.

5. The method of claim 1, further comprising:
transmitting, during a second time period different from the first time period, a second modulated testing signal from the second transmitter port of the transmitter to the second receiver port of the receiver along the second path of the differential signal;
driving, during the second time period, a constant voltage on the first transmitter port of the transmitter to the first receiver port of the receiver along the first path of the differential signal; and
determining whether the second on-die capacitor in the receiver in the second path is functional, based on the second modulated testing signal.

6. The method of claim 1, further comprising:
reporting a defective capacitor based on the determination of whether the first on-die capacitor is functional.

7. The method of claim 1, further comprising:
upon determining the on-die capacitor is functional, performing normal operations where the transmitter transmits complementary AC signals in the first and second paths of the differential signal.

8. A communication system, comprising:
a transmitter comprising a first transmitter port and a second transmitter port;
a receiver comprising a first receiver port and a second receiver port;
first and second signal paths forming a differential signal path that communicatively couples the transmitter and the receiver,
wherein the transmitter is configured to:
transmit, during a first time period, a first modulated testing signal from the first transmitter port to the first receiver port along the first path, the first receiver port connected to a first on-die capacitor in the receiver along the first path;
drive, during the first time period, a constant voltage on the second transmitter port to the second receiver port along the second path; and
determine whether the first on-die capacitor is functional, based on the first modulated testing signal.

9. The communication system of claim 8, wherein the transmitter comprises a driver circuit, the driver circuit comprising a first NAND gate and a first NOR gate configured to drive the first modulated signal.

10. The communication system of claim 9, wherein the driver circuit further comprises a second NAND gate and a second NOR gate configured to drive a second modulated signal.

11. The communication system of claim 9, wherein the transmitter further comprises differential testing signal logic coupled to the first NAND gate and the first NOR gate, the differential testing signal logic transmitting signals to the first NAND gate and to the first NOR gate.

12. The communication system of claim 8, wherein the transmitter is further configured to:
transmitting, during a second time period different from the first time period, a second modulated testing signal from the second transmitter port to a second receiver port, the second receiver port connected to a second on-die capacitor in the receiver in the second path;
driving, during the second time period, a constant voltage on the first transmitter port to the first receiver port; and
determining whether the second on-die capacitor is functional, based on the second modulated testing signal.

13. The communication system of claim 8, wherein a first IC comprises the transmitter, and a second IC comprises the receiver.

* * * * *